US010280072B2

(12) United States Patent
Fedgenhaeuer et al.

(10) Patent No.: US 10,280,072 B2
(45) Date of Patent: May 7, 2019

(54) ELECTRONIC COMPONENT WITH A COMPONENT HOUSING

(71) Applicant: HELLA GMBH & CO. KGAA, Lippstadt (DE)

(72) Inventors: Silvio Fedgenhaeuer, Bremen (DE); Sergej Tonewizki, Diepholz (DE); Ingo Zoyke, Stuhr-Moordeich (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 38 days.

(21) Appl. No.: 15/463,450

(22) Filed: Mar. 20, 2017

(65) Prior Publication Data

US 2017/0283248 A1 Oct. 5, 2017

(30) Foreign Application Priority Data

Mar. 30, 2016 (DE) ........................ 10 2016 003 658

(51) Int. Cl.
*B81B 7/00* (2006.01)
*F01M 11/12* (2006.01)
(Continued)

(52) U.S. Cl.
CPC ........... *B81B 7/0058* (2013.01); *F01M 11/12* (2013.01); *G01F 23/296* (2013.01);
(Continued)

(58) Field of Classification Search
CPC .......... B81B 7/0058; B81B 2201/0264; B81B 2201/0214; G01F 23/296; H01L 41/1132; F01M 11/12
See application file for complete search history.

(56) References Cited

U.S. PATENT DOCUMENTS 6,393,922 B1    5/2002  Winterer
7,954,384 B2 *  6/2011  Koehler ................ G01L 19/143
                                        73/756
(Continued)

FOREIGN PATENT DOCUMENTS

CN    201748957 U    2/2011
DE    197 03 206 A1  7/1998
(Continued)

OTHER PUBLICATIONS

Search Report issued in corresponding German patent application No. 102016003658.3 (20 pages).
(Continued)

*Primary Examiner* — Freddie Kirkland, III
(74) *Attorney, Agent, or Firm* — Muncy, Geissler, Olds & Lowe, P.C.

(57) ABSTRACT

In an electronic component with a component housing and an integrated circuit with sensor function which is accommodated in a plastic electronic housing, wherein the component housing has a cutaway in the region of the circuit with sensor function so that the integrated circuit can perform its function as a sensor through the cutaways, the component housing lies flush with the edge of the cutaway on the electronic housing and is joined in sealing manner with an adhesive bond to the electronic housing. The component housing has an approximately vertical section on the edge of the cutaways, which section extends along the side of the electronic housing. A horizontal section is also present and projects horizontally over the electronic housing.

10 Claims, 1 Drawing Sheet

(51) Int. Cl.
*G01F 23/296* (2006.01)
*H01L 41/113* (2006.01)

(52) U.S. Cl.
CPC .. *H01L 41/1132* (2013.01); *B81B 2201/0214* (2013.01); *B81B 2201/0264* (2013.01)

(56) References Cited

U.S. PATENT DOCUMENTS

| | | | |
|---|---|---|---|
| 8,191,423 | B2 | 6/2012 | Chiou et al. |
| 8,276,445 | B2 | 10/2012 | Reiche |
| 8,297,127 | B2 * | 10/2012 | Wade .................. G01L 19/0038 |
| | | | 73/721 |
| 8,555,716 | B2 | 10/2013 | Niemann et al. |
| 8,596,139 | B2 | 12/2013 | Mueller et al. |
| 9,006,847 | B2 * | 4/2015 | Welter ................ G01L 19/0084 |
| | | | 257/417 |
| 9,087,504 | B2 | 7/2015 | Mueller et al. |
| 9,163,974 | B1 * | 10/2015 | Kekalainen ............. G01F 23/00 |
| 9,829,369 | B2 * | 11/2017 | Kuehnel ............. G01F 23/2962 |
| 9,856,134 | B2 * | 1/2018 | Dehe .................... B81B 7/0048 |
| 2009/0314575 | A1 | 12/2009 | Reiche |
| 2010/0089169 | A1 | 4/2010 | Koehler et al. |
| 2012/0174680 | A1 * | 7/2012 | Wade .................. G01L 19/0038 |
| | | | 73/721 |
| 2013/0221458 | A1 | 8/2013 | Walter et al. |
| 2013/0270749 | A1 | 10/2013 | Hachtmann et al. |
| 2014/0352426 | A1 * | 12/2014 | Kuehnel ............. G01F 23/2962 |
| | | | 73/290 V |
| 2015/0090018 | A1 | 4/2015 | Niemann et al. |
| 2015/0377684 | A1 | 12/2015 | Strackerjan et al. |

FOREIGN PATENT DOCUMENTS

| | | |
|---|---|---|
| DE | 100 57 397 A1 | 5/2002 |
| DE | 10 2005 006 753 A1 | 8/2006 |
| DE | 10 2005 043 263 A1 | 3/2007 |
| DE | 10 2006 040 344 A1 | 3/2008 |
| DE | 10 2007 014 539 A1 | 10/2008 |
| DE | 10 2007 014 540 A1 | 10/2008 |
| DE | 20 2008 011 684 U1 | 12/2008 |
| DE | 10 2008 017 183 A1 | 10/2009 |
| DE | 10 2008 055 126 A1 | 7/2010 |
| DE | 10 2009 036 888 A1 | 12/2010 |
| DE | 10 2009 046 148 A1 | 5/2011 |
| DE | 10 2010 011 490 A1 | 9/2011 |
| DE | 10 2010 039 599 A1 | 2/2012 |
| DE | 11 2011 101 128 T5 | 2/2013 |
| DE | 10 2012 200 757 A1 | 7/2013 |
| DE | 10 2012 002 011 A1 | 8/2013 |
| DE | 10 2012 004 932 A1 | 9/2013 |
| DE | 10 2012 014 307 A1 | 1/2014 |
| DE | 10 2013 016 164 A1 | 4/2015 |
| DE | 10 2014 009 543 A1 | 12/2015 |
| DE | 10 2014 009 610 A1 | 12/2015 |

OTHER PUBLICATIONS

Epoxy resin adhesives for high temperature applications, DELO Company, Mar. 18, 2015 https://www.delo.de/fileadmin/user_upload/documents/de/brochures/Epoxidharz-Klebstoffe_fuer_Hochtemperatur-Anwendungen_DE.pdf (last retrieved on Mar. 29, 2017).
Habenicht, Gerd, "Plastics and other non-metallic materials" Bonding: Basics, technologies,applications, 2009, pp. 645-737.
Habenicht, Gerd, "Constructive design of metal bonding" Bonding: Basics, technologies, applications, 2009, pp. 529-537.

* cited by examiner

ELECTRONIC COMPONENT WITH A COMPONENT HOUSING

BACKGROUND OF THE INVENTION

Field of the Invention

The invention relates to an electronic component with a component housing and an integrated circuit with sensor function which is accommodated in a plastic electronic housing, wherein the component housing has a cutaway in the area of the circuit with sensor function, so that the integrated circuit is able to perform its function as a sensor through the cutaway.

Brief Description of the Related Art

Species-related sensors are known from U.S. Pat. No. 8,596,139 B2 and U.S. Pat. No. 9,087,504 B2 for example. In those documents, electronic components, specifically ultrasonic transducers with a larger component housing are known. In this component housing, an integrated circuit with sensor function is accommodated. The outer component housing has a cutaway which is arranged centrally above the integrated circuit with sensor function and through which the ultrasonic waves can pass, so that a measurement can be carried out above the component housing.

SUMMARY OF THE INVENTION

The object underlying the invention is to produce an electronic component of the type described in the introduction, with which protection can be assured for the integrated circuit particularly simply and reliably against external influences, particularly aggressive media.

This object is solved with an electronic component having the features of patent claim 1. Advantageous variants of the invention are described in the subordinate claims.

In an electronic component with a component housing and an integrated circuit with sensor function which is accommodated in a plastic electronic housing, wherein the component housing has a cutaway close to the circuit with sensor function so that the integrated circuit can perform its function as a sensor through the cutaway, it is provided as essential to the invention that the component housing lies flush and a buts with the edge of the cutaway on the electronic housing and is connected to the electronic housing in sealing manner via an adhesive bond, and that the component housing has a first, vertical section on the edge of the cutaway, which section extends along the side of the electronic housing, and a second, horizontal section which projects horizontally over the electronic housing. With such an electronic component, a plastic electronic housing can be joined adhesively to the component housing or sensor housing to guarantee imperviousness or tightness to the medium that is to be detected. The medium to be detected may be in the liquid or gas phase. It is particularly advantageous if the surface of the electronic housing to be detected is not influenced at all, or at least only minimally. This is achieved with a peripheral adhesion on the electronic housing, wherein the adhesion consists laterally and also from above in a small subregion.

In a preferred variation of the invention, the vertical section on the edge of the cutaway is longer than the horizontal section. The horizontal section only protrudes over a small subregion of the electronic housing, that is to say only over a small peripheral area. The vertical section is preferably more than twice as long as the horizontal section, and particularly preferably more than three times as long as the horizontal section.

In another preferred embodiment of the invention, a projection is conformed in the component housing on the edge of the cutaway, wherein the distance between the projection and the electronic housing is smaller than the distance between the rest of the component housing and the electronic housing. This projection is particularly preferably arranged between the horizontal section and the vertical section on the edge of the component housing. The function of this projection is to enable the excess adhesive to be collected. A tolerance compensation takes place. The collection of the adhesive by capillary action prevents the adhesive from flowing onto the surface that is to be detected. This variation with the projection and the distance resulting therefrom creates capillary forces. In this way, excess adhesive is directed not onto the sensor housing, but particularly into the vertical area beside the electronic housing instead, due to collection of the adhesive under the effect of capillary action. The electronic housing is bonded imperviously, regardless of the viscosity of the adhesive due to the defined positioning of the adhesive and the effective capillary force. A design that is optimal for the installation space is obtained.

When viewed in cross-section, the projection is approximately rectangular and aligned with the corner of the electronic housing (viewed in cross-section). When viewed in three dimensions, it more closely resembles two peripheral edges which are positioned facing each other. Viewed in cross-section, the angle bisectors of the projections and of the electronic housing would roughly form a line. In this area, the distance between the projection and the electronic housing is minimal. The distance between the projection and the electronic housing is preferably equal to 40% to 60% of the distance between the edge of the component housing and the electronic housing in other regions. This enables the creation of a capillary effect, and excess adhesive not drawn onto the surface to be detected but instead into other areas, particularly the vertical region between the electronic housing and the component housing by the capillary effect.

In a preferred variation of the invention, the integrated circuit with the electronic housing is a SOIC component made from thermosetting plastic. That is to say a "Small Outline Integrated Circuit" which is encased or encapsulated in thermosetting plastic.

In the preferred variation of the invention, the electronic component is a fill level measurement device. In such a case, the integrated circuit with sensor function is preferably an ultrasonic sensor. In a preferred variation, ultrasonic sensors of such kind are fitted in an oil-lubricated engine, for example, to measure the fill level of the engine oil in an engine of a car. The component housing seals the electronic housing off from the surrounding medium, particularly the medium that is to be measured. This may be liquid or gaseous. Besides being a fill level sensor, the sensor may also be a pressure sensor or gas sensor.

BRIEF DESCRIPTION OF THE DRAWING

In the following, the invention will be explained further with reference to an exemplary embodiment shown in the drawing. In detail, the schematic diagrams show in.

DETAILED DESCRIPTION OF THE PREFERRED EMBODIMENTS

Figure 1:
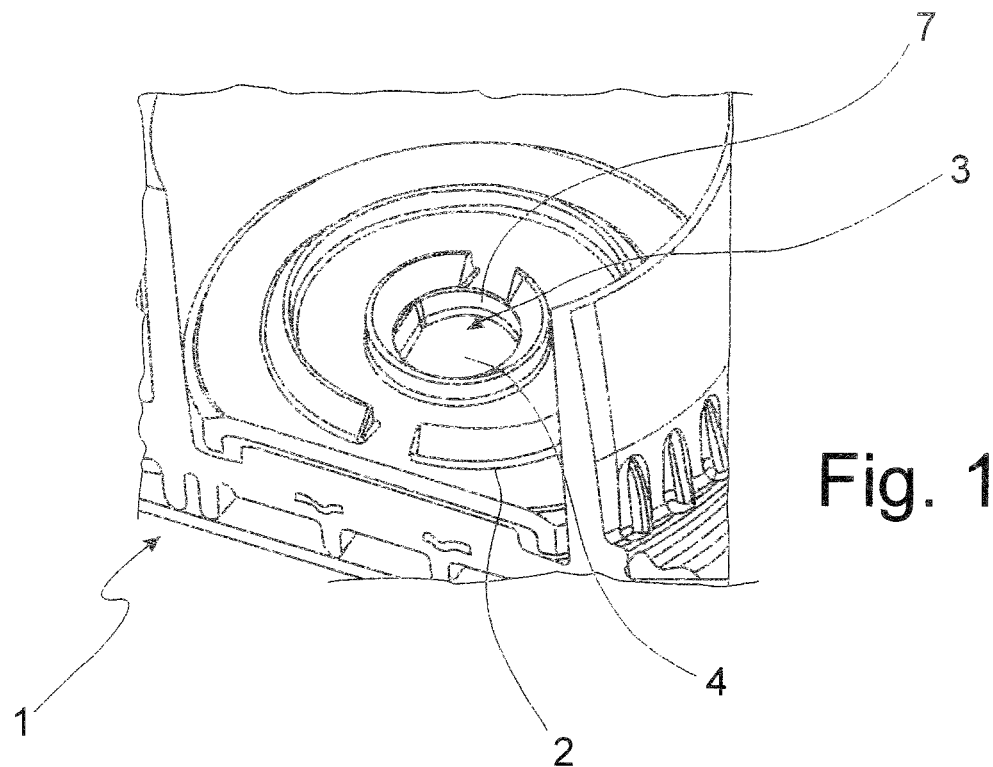
FIG. 1: a top view of an electronic component with the component housing.

FIG. 1 shows an electronic component 1 with a component housing 2. The component housing 2 does not necessarily have to be the outermost housing of a complete assembly, but is understood to be a component housing 2 or possibly also a sensor housing that covers the actual sensor and/or an integrated circuit 5 with sensor and/or protects it from a surrounding medium. The component housing 2 has a central cutaway 3, below which an electronic housing 4 is arranged.

Figure 2:
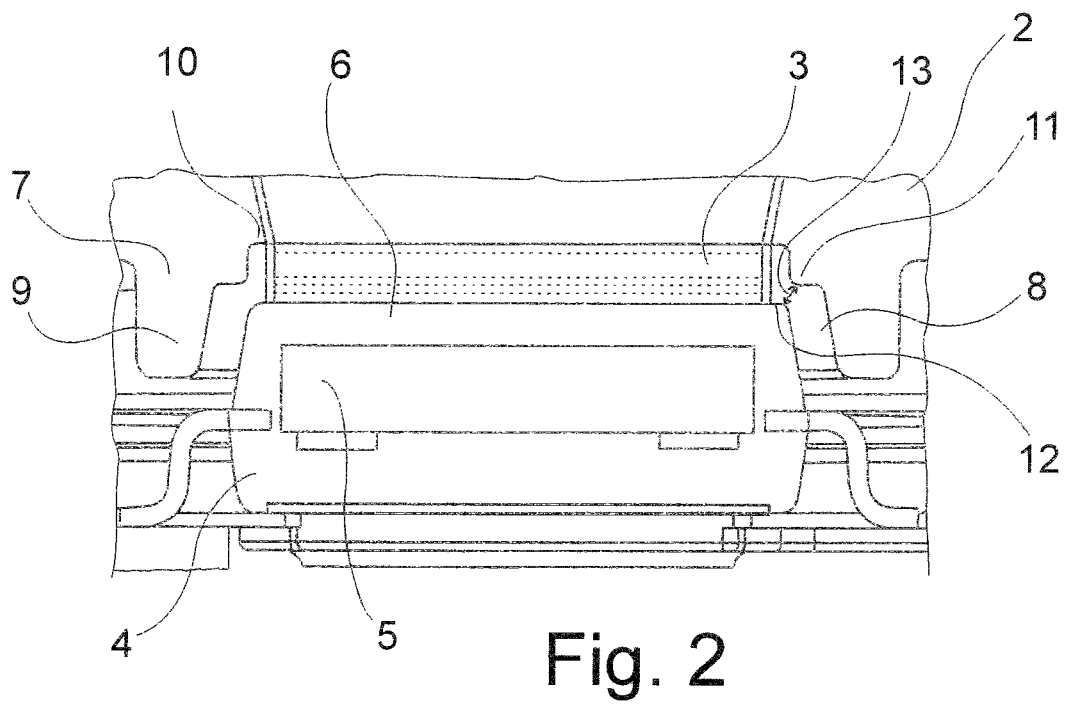
FIG. 2: a cross-section through the integrated circuit with electronic housing and a part of the component housing.

FIG. 2 shows a cross-section through electronic housing 4 with the integrated circuit 5 with sensor function accommodated therein. The area 6 to be detected, which is arranged closed to the cutaway 3 in the component housing 2, is located on top of the electronic housing 4. Component housing 2 has an edge 7 around cutaway 3, which lies in sealing manner against electronic housing 4. A narrow gap, remains between the edge 7 and the electronic housing 4, and this is filled with adhesive 8. Edge 7 may be divided into a vertical section 9 and a horizontal section 10. The vertical section 9, which is aligned parallel to a vertical side of the electronic housing 4, is longer than the horizontal section 10 of the edge 7, which is arranged parallel to the horizontal top side, on which the surface to be detected 6 is arranged. A projection 11 is conformed in the edge 7 of the component housing 2 in the transition area between the vertical section 9 and the horizontal section 10. A minimal distance 13, which is smaller than the distance between the electronic housing 4 and the edge 7 in the area of the vertical section 9 of the component housing 2 and is also smaller than the distance between the top side of the electronic housing 4, that is to say particularly in the area of the surface 6 to be detected of the electronic housing 4 and the horizontal section 10 of the component housing 2 is formed between projection 11 and the upper, outer edge border 12 of the electronic housing 4. This minimal distance is so small that capillary forces are effective, and liquid adhesive is drawn particularly into the area of the vertical section 9 and does not flow onto the detecting surface 6 of the electronic housing 4.

All of the features described in the preceding description and in the claims can be used in any order and combination with the features of the independent claim. The disclosure of the invention is thus not limited to the feature combinations described and claimed, but rather all feature combinations that are practicable within the scope of the invention are to be considered disclosed.

The invention claimed is:

1. An electronic component with a component housing and an integrated circuit with sensor function, which is accommodated in an electronic housing made of plastic, wherein the component housing includes a cutaway in the region of the integrated circuit sensor function, so that the integrated circuit is able to perform its function as sensor through the cutaway, wherein, the component housing lies flush against the edge of cutaway on the electronic housing and is joined to the electronic housing in sealing manner by means of an adhesive bond, the component housing has a first section on the edge of the cutaway, which extends along the side of the electronic housing and a second section which projects over the electronic housing;

wherein a projection is formed in the component housing on the edge of the cutaway, wherein the distance between the projection and the electronic housing is smaller than the distance between the rest of the component housing and the electronic housing.

2. The electronic component according to claim 1, wherein the first, vertical section is longer than the second, horizontal section.

3. The electronic component according to claim 1, wherein the projection is arranged between the first section and the second section.

4. The electronic housing according to claim 1, wherein the projection when viewed in cross-section is approximately rectangular and is aligned with the edge border of the electronic housing.

5. The electronic component according to claim 1, wherein the distance between the projection and the electronic housing is equal to 40% to 60% of the distance that exists between the edge of the component housing and the electronic housing in other regions.

6. The electronic component according to claim 1, wherein the integrated circuit with the electronic housing is a SOIC component with a thermosetting plastic housing.

7. The electronic component according to claim 1, wherein the electronic component is a fill level measurement device.

8. The electronic component according to claim 1, wherein the integrated circuit with sensor function is an ultrasonic sensor.

9. The electronic component according to claim 1, wherein the component housing seals the electronic housing off from surrounding medium.

10. An internal combustion engine, in particular for a motor vehicle, having an oil-lubricated engine, the engine having a device to measure that fill level of the engine oil, wherein, the device measuring the fill level is equipped with an electronic component according to claim 1.

* * * * *